United States Patent
Mashiko et al.

(10) Patent No.: US 6,177,826 B1
(45) Date of Patent: *Jan. 23, 2001

(54) SILICON-ON-INSULATOR CIRCUIT HAVING SERIES CONNECTED PMOS TRANSISTORS EACH HAVING CONNECTED BODY AND GATE

(75) Inventors: Koichiro Mashiko; Kimio Ueda; Yoshiki Wada, all of Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/053,700

(22) Filed: Apr. 2, 1998

(30) Foreign Application Priority Data

Dec. 1, 1997 (JP) ............................................ 9-330637

(51) Int. Cl.$^7$ ........................ H03K 19/0948; H03K 19/20
(52) U.S. Cl. .......................... 327/534; 327/437; 327/225; 326/34; 326/121
(58) Field of Search .................................. 327/534, 434, 327/437, 576, 199, 214, 225; 326/121, 112, 119, 9, 17, 31, 33, 34

(56) References Cited

U.S. PATENT DOCUMENTS

| | | | |
|---|---|---|---|
| 4,217,502 | * 8/1980 | Suzuki et al. | 326/58 |
| 5,495,122 | * 2/1996 | Tada | 257/392 |
| 5,543,734 | * 8/1996 | Volk et al. | 326/33 |
| 5,559,368 | * 9/1996 | Hu et al. | 327/328 |
| 5,808,346 | * 9/1998 | Ueda | 257/774 |
| 5,821,769 | * 10/1998 | Douseki | 326/34 |

FOREIGN PATENT DOCUMENTS 3-66159  3/1991 (JP) ............................. H01L/27/092

OTHER PUBLICATIONS

Fariborz Assaderaghi et al., "A Dynamic Threshold Voltage MOSFET (DTMOS) for Ultra–Low Voltage Operation", IEEE IEDM 94, 1994, pp. 809–812.

* cited by examiner

Primary Examiner—Timothy P. Callahan
Assistant Examiner—Terry L. Englund
(74) Attorney, Agent, or Firm—Burns, Doane, Swecker & Mathis, LLP

(57) ABSTRACT

A Silicon-On-Insulator (SOI) CMOS circuit comprises a plurality of PMOS transistors connected in series to each other, each of the plurality of PMOS transistors having its body and gate connected to each other, and at least an NMOS transistor connected to one of the plurality of PMOS transistors, the NMOS transistor having its body connected to a low reference potential having a value of ground. The SOI CMOS circuit can further comprise a plurality of potential limiting circuits each connected between the body and gate of each of the plurality of PMOS transistors, for setting a lower limit of the potential of the body of each of the plurality of PMOS transistors to a voltage between a high reference potential and a potential obtained by subtracting a built-in potential from the high reference potential.

11 Claims, 5 Drawing Sheets

SILICON-ON-INSULATOR CIRCUIT HAVING SERIES CONNECTED PMOS TRANSISTORS EACH HAVING CONNECTED BODY AND GATE

BACKGROUND OF THE INVENTION

1. Field of the Invention

The present invention relates to a Silicon-On-Insulator (SOI) CMOS circuit provided with a plurality of PMOS transistors connected in series to each other.

2. Description of the Prior Art

Large-scale integration or LSI circuits have grown continually more powerful. Researches into integrating a more huge number of components on a single chip and speeding up LSI circuits have been ongoing. These researches have resulted in increases in power dissipation in LSI circuits. Some of the latest microprocessors consume tens of watts of power. Such increases in power dissipation in LSI circuits cause the following problems. The first problem is that heat internally generated in a chip has a deleterious effect on the reliability of the chip. The second problem is that a measure directed toward the dissipation of the internally generated heat, such as a cooling fan, causes an increase in the cost of manufacturing the chip. The third problem is that mobile information terminal equipment employing such high power LSI circuits is not easy-to-use because battery life is short. Thus the urgent challenge for manufactures, as well as users' desire, is to reduce the power dissipation in LSI circuits while maintaining their performance.

The most effective measure of reducing the power dissipation in an LSI circuit is to reduce the power supply voltage. However, a reduction in the power supply voltage causes a reduction in the response performance of MOS transistors included in the LSI circuit and hence a reduction in the operating speed of the LSI circuit. Various measures directed toward the prevention of reduction in the operation speed of LSI circuits caused by reduction in the power supply voltage have been taken. Recently Silicon-On-Insulator (SOI) CMOS circuits have captured much of the spotlight as such the measures.

SOI CMOS circuits provide three advantages as follows. The first advantage is that SOI CMOS circuits have low parasitic capacitance because they have a buried oxide film, resulting in reduction in the time required for charging and discharging a load and hence increases in the circuit speed, as disclosed in lines 2 through 8 on the right column of pp. 1106 of "Research and development trends of SOI technology", Journal of Applied Physics Society of Japan, Vol. 64, No. 11, pp.1104–1110, 1995. In other words, the first advantage is that even though a measure is taken to reduce the power supply voltage applied to an SOI CMOS circuit, the circuit speed can be maintained as it is high.

The second advantage is that even though a measure is taken to reduce the power supply voltage applied to an SOI CMOS circuit, the switching speed of MOS transistors is not reduced because the threshold voltages of the MOS transistors do not increase by virtue of the bias potential of their substrates, as disclosed in lines 23 through 33 on the right column of pp. 1106 of the above reference. Accordingly, even though a measure is taken to reduce the power supply voltage applied to an SOI CMOS circuit, the circuit speed can be maintained as it is high.

The third advantage is that the current drive capability of MOS transistors can be maintained at low power supply voltages by controlling the potential of the bodies of the MOS transistors, as disclosed in "A Dynamic Threshold Voltage MOSFET (DTMOS) for Ultra-Low Voltage Operation", IEDM94, pp.809–812, 1994. Accordingly, even though a measure is taken to reduce the power supply voltage applied to an SOI CMOS circuit, the circuit speed can be maintained as it is high.

Figure 14:
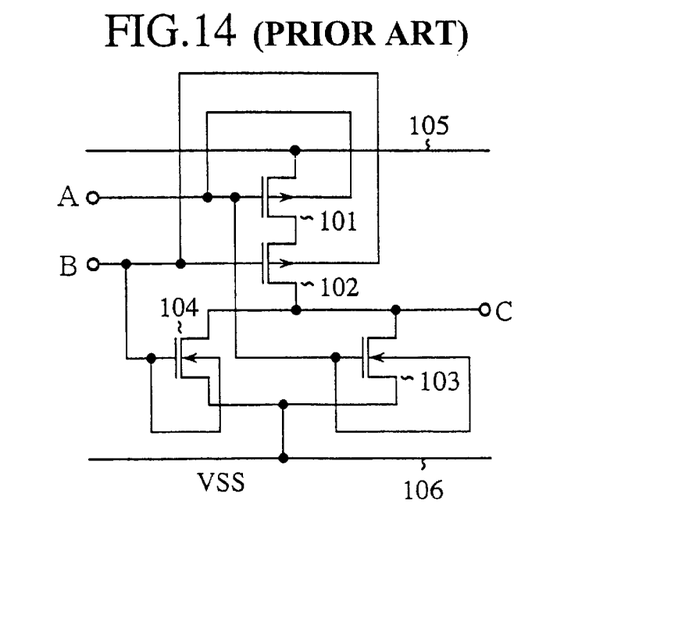
FIG. 14 is a schematic circuit diagram showing the structure of a prior art SOI CMOS circuit.

Referring next to FIG. 14, there is illustrated a schematic circuit diagram of a prior art SOI CMOS circuit. The prior art SOI CMOS circuit serves as a NOR gate. In FIG. 14, reference numerals 101 and 102 denote first and second PMOS transistors, respectively, 103 and 104 denote first and second NMOS transistors, respectively, 105 denotes a high reference potential line with a power supply potential connected to a power supply, 106 denotes a low reference potential line with a ground potential connected to ground, A and B denote first and second input terminals to which signals are applied to, respectively, and C denotes an output terminal through which an output signal is furnished.

The prior art SOI CMOS circuit shown in FIG. 14 can maintain a high operating speed even at low power supply voltages by tying the bodies and gates of the first and second PMOS transistors 1 and 2 together, respectively, and by tying the bodies and gates of the first and second NMOS transistors 3 and 4 together, respectively.

While such the prior art SOI CMOS circuit can maintain a high operating speed even at low power supply voltages, it suffers from the following problems. The first problem with the prior art SOI CMOS circuit is that when NMOS transistors have the same size as PMOS transistors, the amount of current flowing in each NMOS transistor is two times as large as that flowing in each PMOS transistor, and an increase in a difference between the carrier mobility of each NMOS transistor and that of each PMOS transistor and hence an increase in a difference between the amount of current flowing in each NMOS transistor and the amount of current flowing in each PMOS transistor result from higher integration of components into the chip and lower power supply voltages, resulting in no margin for the operation of the prior art SOI CMOS circuit, such as a NOR gate, including the PMOS transistors connected in series to each other and hence low noise immunity because of a displacement of the logical threshold voltage of the SOI CMOS circuit, which determines the logic levels of signals, from a voltage intermediate between a power supply potential and a ground potential, as disclosed in FIG. 11 of pp.153 of Journal of NIKKEI Micro Device issued in September, 1994. Another problem is that since the length of the rising time of output signals furnished by such the prior art SOI CMOS circuit differs considerably from that of their falling time, it is difficult to design and manufacture a high performance LSI circuit which operates with a high degree of reliability.

Although changing the sizes of NMOS and PMOS transistors included in SOI CMOS circuits can be a measure to solve the above problems, this measure causes another problem that the circuit layout increases in complexity because it is difficult to efficiently arrange and wire NMOS and PMOS transistors.

SUMMARY OF THE INVENTION

The present invention is made to overcome the above-mentioned problems. It is therefore an object of the present invention to provide an SOI CMOS circuit capable of setting its logical threshold voltage to a voltage having a value in the vicinity of a certain value intermediate between the value of the power supply potential and that of the ground potential.

In accordance with one aspect of the present invention, there is provided an SOI CMOS circuit comprising: a plurality of PMOS transistors connected in series to each other, each of the plurality of PMOS transistors having its body and gate connected to each other; and at least an NMOS transistor connected to one of the plurality of PMOS transistors, the NMOS transistor having its body connected to a low reference potential having a value of ground.

In accordance with a preferred embodiment of the present invention, the SOI CMOS circuit further comprises a plurality of potential limiting circuits each connected between the body and gate of each of the plurality of PMOS transistors, for setting a lower limit of potential of the body of each of the plurality of PMOS transistors to a voltage between a high reference potential and a potential obtained by subtracting a built-in potential from the high reference potential. Preferably, each of the plurality of potential limiting circuit includes a PMOS transistor having its source connected to the gate of a corresponding one of the plurality of PMOS transistors, and its gate connected to its drain and the body of the corresponding one of the plurality of PMOS transistors.

In accordance with another aspect of the present invention, there is provided an SOI CMOS circuit comprising: a plurality of PMOS transistors connected in series to each other; at least an NMOS transistor connected to one of the plurality of PMOS transistors, the NMOS transistor having its body connected to a low reference potential having a value of ground; and a body potential generating circuit for generating a body potential between a high reference potential and a potential obtained by subtracting a built-in potential from the high reference potential and for applying the body potential to the bodies of the plurality of PMOS transistor. Preferably, the body potential generating circuit includes a PMOS transistor having its drain connected to its gate and the bodies of the plurality of PMOS transistors.

In accordance with another aspect of the present invention, there is provided an SOI CMOS circuit comprising: a plurality of PMOS transistors connected in series to each other, each of the plurality of PMOS transistor having its body connected to a high reference potential; at least an NMOS transistor connected to one of the plurality of PMOS transistors; and a body potential generating circuit for generating a body potential between a low reference potential having a value of ground and a potential obtained by subtracting a built-in potential from the low reference potential and for applying the body potential to the body of the NMOS transistor. Preferably, the body potential generating circuit includes an NMOS transistor having its drain connected to its gate and the body of the first NMOS transistor.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
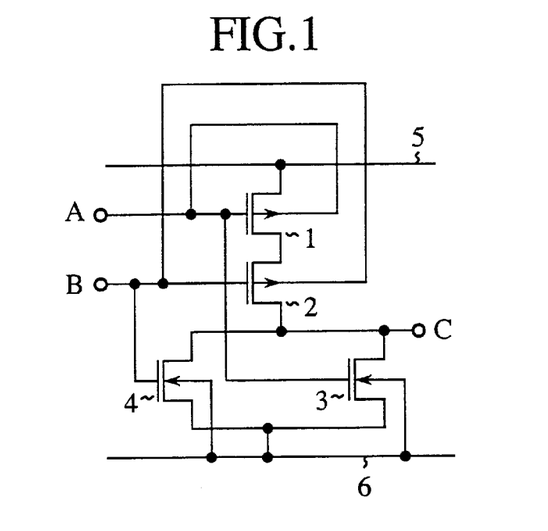
FIG. 1 is a schematic circuit diagram of an SOI CMOS circuit according to a first embodiment of the present invention.

Referring next to FIG. 1, there is illustrated a schematic circuit diagram of an SOI CMOS circuit according to a first embodiment of the present invention. The SOI CMOS circuit shown serves as a NOR gate. In FIG. 1, reference numerals 1 and 2 denote first and second PMOS transistors, respectively, 3 and 4 denote first and second NMOS transistors, respectively, 5 denotes a high reference potential line with a power supply potential connected to a power supply and having a value of VDD, 6 denotes a low reference potential line with a ground potential connected to ground and having a value of VSS, A and B denote first and second input terminals to which signals are applied to, respectively, and C denotes an output terminal through which an output signal is furnished.

In the SOI CMOS circuit according to the first embodiment of the present invention shown in FIG. 1, the first and second PMOS transistors 1 and 2 are connected in series to each other, and the first and second NMOS transistors 3 and 4 are connected to the second PMOS transistor 2. The bodies of the first and second PMOS transistors 1 and 2 are connected to their gates, respectively. The bodies of the first and second NMOS transistors 3 and 4 are connected to the low reference potential line 6. The first input terminal A is connected to both the gate of the first PMOS transistor 1 and the gate of the first NMOS transistor 3. The first input terminal B is connected to both the gate of the second PMOS transistor 2 and the gate of the second NMOS transistor 4.

In operation, when a signal at a LOW logic level having the ground potential VSS is applied to the gate of the first PMOS transistor 1, the first PMOS transistor 1 is turned on. Simultaneously, the body of the first PMOS transistor 1 has the same potential as the signal applied to its gate, i.e., the ground potential VSS, and therefore the threshold voltage of the first PMOS transistor 1 drops, resulting in a much higher current drive. On the other hand, when a signal at a HIGH logic level having the power supply potential VDD is applied to the gate of the first PMOS transistor 1, the first PMOS transistor 1 is turned off. Simultaneously, the body of the first PMOS transistor 1 has the same potential as the input signal applied to its gate, i.e., the power supply potential VDD, and therefore the threshold voltage of the first PMOS transistor 1 increases, resulting in reducing the leakage current.

Similarly, when a signal at a LOW logic level having the ground potential VSS is applied to the gate of the second PMOS transistor 2, the second PMOS transistor 2 is turned on. Simultaneously, the body of the second PMOS transistor 2 has the ground potential VSS. As a result, the threshold voltage of the second PMOS transistor 2 drops, resulting in a much higher current drive. On the other hand, when a signal at a HIGH logic level having the power supply potential VDD is applied to the gate of the second PMOS transistor 2, the second PMOS transistor 2 is turned off. Simultaneously, the body of the second PMOS transistor 2 has the power supply potential VDD. As a result, the threshold voltage of the second PMOS transistor 2 increases, resulting in reducing the leakage current.

Even though a signal at either a LOW logic level or a HIGH logic level is applied to the gate of the first NMOS transistor 3, its current drive ability and the leakage current are not varied because the threshold voltage of the first NMOS transistor 3 is not varied. Similarly, even though a signal at either a LOW logic level or a HIGH logic level is applied to the gate of the second NMOS transistor 4, its current drive ability and the leakage current are not varied because the threshold voltage of the second NMOS transistor 4 is not varied.

As previously mentioned, according to the first embodiment, the bodies of the first and second PMOS transistors 1 and 2 are connected to their gates, respectively, and the bodies of the first and second NMOS transistors 3 and 4 are connected to the low reference potential line 6. Thus when both the first and second PMOS transistors 1 and 2 are held at the ON state, the current drive abilities of the first and second PMOS transistors 1 and 2 are enhanced while the current drive abilities of the first and second NMOS transistors 3 and 4 are not enhanced even though the first and second NMOS transistors 3 and 4 are held at the ON state. As a result, the current drive abilities of the first and second PMOS transistors 1 and 2 approach those of the first and second NMOS transistors 3 and 4, and therefore the difference between currents flowing through the first and second PMOS transistors 1 and 2 and currents flowing through the first and second NMOS transistors 3 and 4 can be reduced. Therefore, the logical threshold voltage of the SOI CMOS circuit, which determines the logic levels of signals, can be set correctly to a voltage intermediate between the power supply potential VDD and the ground potential VSS without having to change the sizes of the first and second PMOS transistors 1 and 2 and the first and second NMOS transistors 3 and 4, resulting in a margin for the operation of the SOI CMOS circuit and hence higher noise immunity. In addition, since the difference between the rising time and the falling time of output signals can be reduced, a high-performance LSI circuit which operates with a high degree of reliability can be designed and manufactured easily.

Furthermore, either of the first and second PMOS transistors 1 and 2 can serve as an ideal transistor the current drive ability of which is enhanced when it is held at the ON state, and in which the leakage current is low when it is held at the OFF state.

Second Embodiment

In the first embodiment mentioned above, since the bodies of the first and second PMOS transistors 1 and 2 are directly connected to their gates, there is a possibility that a voltage greater than or equal to the built-in potential VBL is applied between the sources and bodies of the first and second PMOS transistors 1 and 2 if the power supply potential VDD is greater than the built-in potential VBL. In case that the power supply potential VDD is greater than the built-in potential VBL, when a signal at a LOW logic level is applied to the gates of the first and second PMOS transistors 1 and 2, both the bodies of the first and second PMOS transistors 1 and 2 have the same potential as the ground potential VSS, and the sources of the first and second PMOS transistors 1 and 2 have the same potential as the power supply potential VDD, with the result that a voltage greater than or equal to the built-in potential VBL is applied between the sources and bodies of the first and second PMOS transistors 1 and 2. Accordingly, both the first and second PMOS transistors 1 and 2 cannot operate properly because they behave as parasitic bipolar transistors in which their bodies serve as sources, and their sources and drains serve as emitters and collectors, respectively.

Figure 2:
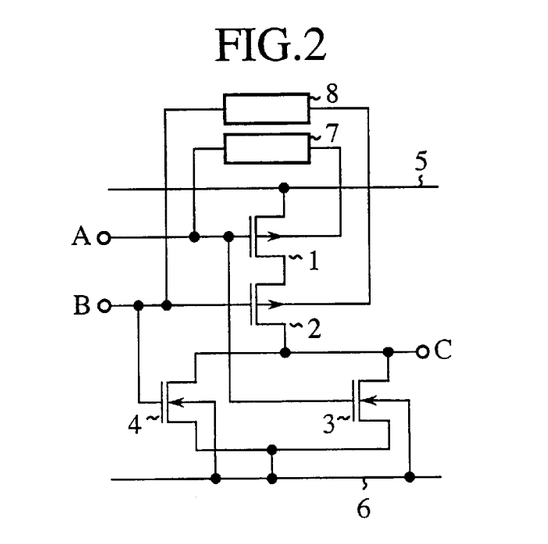
FIG. 2 is a schematic circuit diagram of an SOI CMOS circuit according to a second embodiment of the present invention.

To solve the above problem, an SOI CMOS circuit according to a second embodiment of the present invention is provided with two potential limiting circuits connected between the bodies and gates of the first and second PMOS transistors 1 and 2, respectively, for preventing a voltage greater than or equal to the built-in potential VBL from being applied between the source and body of each of the first and second PMOS transistors 1 and 2 even though the power supply potential VDD is greater than the built-in potential VBL.

Referring next to FIG. 2, there is illustrated a schematic circuit diagram of the SOI CMOS circuit according to the second embodiment of the present invention. The SOI CMOS of the second embodiment can serve as a NOR gate. In FIG. 2, reference numeral 7 denotes a first potential limiting circuit connected between the body and gate of the first PMOS transistor 1, and 2 denotes a second potential limiting circuit connected between the body and gate of the second PMOS transistor 2. The other components of the SOI CMOS circuit of the second embodiment are the same as those of the SOI CMOS circuit of the first embodiment shown in FIG. 1.

Figure 3:
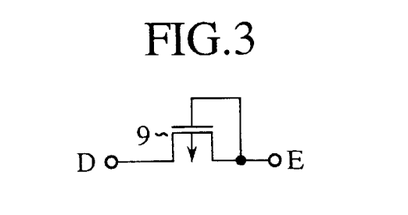
FIG. 3 is a schematic circuit diagram showing the structure of each of first and second potential limiting circuits disposed in the SOI CMOS circuit of FIG. 2 according to the second embodiment of the present invention.

Referring next to FIG. 3, there is illustrated a schematic circuit diagram showing the structure of each of the first and second potential limiting circuits 7 and 8 disposed in the SOI CMOS circuit according to the second embodiment of the present invention. In FIG. 3, reference numeral 9 denotes a PMOS transistor having its gate and drain connected to each other, D denotes a terminal connected to the gate of either the first PMOS transistor 1 or the second PMOS transistor 2, and E denotes another terminal connected to the body of either the first PMOS transistor 1 or the second PMOS transistor 2.

Figure 4:
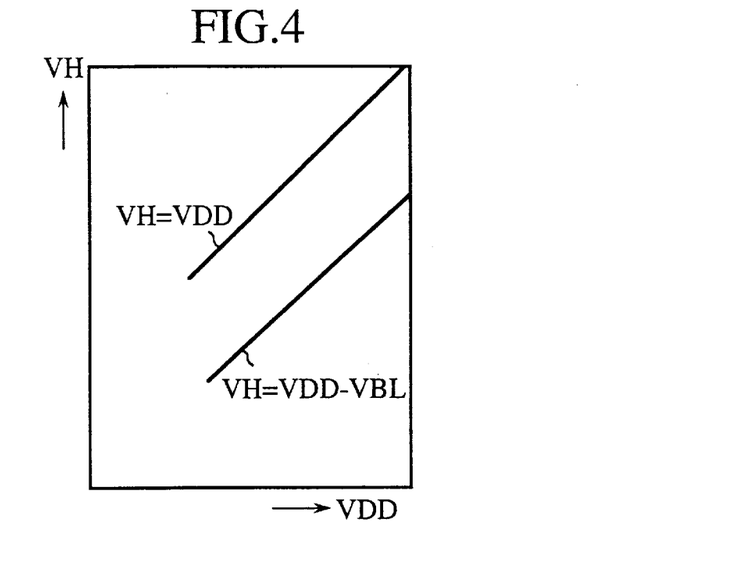
FIG. 4 is a graph showing a range of the lower limit of potential of the bodies of PMOS transistors included in the SOI CMOS circuit of FIG. 2 according to the second embodiment of the present invention.

Each of the first and second potential limiting circuits 7 and 8 as shown in FIG. 3 can set a lower limit value VH of potential of the body, referred to the ground potential, to a certain value intermediate between the value of the power supply potential VDD and a value obtained by subtraction of the value of the built-in potential VBL from the value of the power supply potential VDD, by varying the threshold voltage of the PMOS transistor 9 disposed therein. To be more specific, by varying the threshold voltage of the PMOS transistor 9, each of the first and second potential limiting circuits 7 and 8 sets the lower limit of potential of the body of the corresponding PMOS transistor connected to each of the first and second potential limiting circuits to a voltage having a certain value intermediate between a line VH=VDD and another line VH=VDD−VBL, as shown in FIG. 4. The vertical axis of FIG. 4 shows the lower limit VH of potential, and the horizontal axis shows the power supply potential VDD.

Figure 5A:
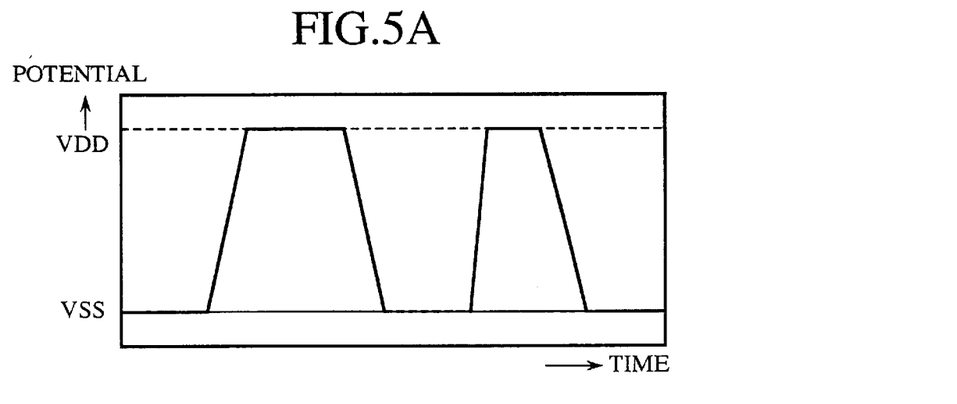
FIGS. 5a and 5b are diagrams showing the operation of the SOI CMOS circuit of FIG. 2 according to the second embodiment of the present invention.
Figure 5B:
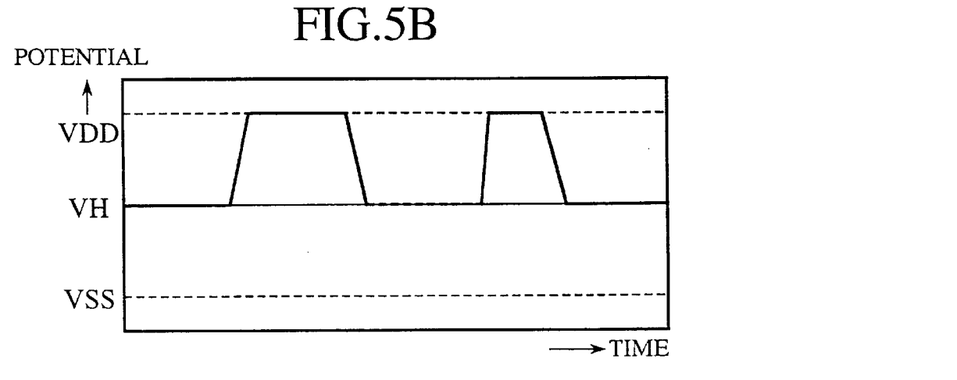

In case that pulses applied to the gate of the first or second PMOS transistor 1 or 2 has an upper limit which is the same as the power supply potential VDD and a lower limit which is the same as the ground potential VSS, as shown in FIG. 5a, the potential of the body of the first or second PMOS transistor 1 or 2 becomes to be VH when the input pulses have a potential less than or equal to VH, and to be the same as those of the input pulses when they have a potential greater than VH, a shown in FIG. 5b. In FIG. 5a, the vertical axis shows the potential of each input pulse. In FIG. 5b, the vertical axis shows the potential of the body of the first or second PMOS transistor 1 or 2. In either of FIGS. 5a and 5b, the horizontal axis shows time.

As previously explained, since the SOI CMOS circuit according to the second embodiment of the present invention includes the first and second potential limiting circuits 7 and 8 connected between the bodies and gates of the first and second PMOS transistors 1 and 2, respectively, for setting the lower limit VH of potential of the body, referred to the ground potential, to a certain value intermediate between the value of the power supply potential VDD and a value obtained by subtraction of the value of the built-in potential VBL from the value of the power supply potential VDD, and the first and second NMOS transistors 3 and 4 having their bodies connected to the low reference potential line 6, the second embodiment can offer the same advantages as provided by the first embodiment. That is, the logical threshold voltage of the SOI CMOS circuit, which determines the logic levels of signals, can be set correctly to a voltage intermediate between the power supply potential VDD and the ground potential VSS without having to change the sizes of the first and second PMOS transistors 1 and 2 and the first and second NMOS transistors 3 and 4, resulting in a margin for the operation of the SOI CMOS circuit and hence higher noise immunity. Besides since the difference between the rising time and the falling time of output signals can be reduced, a high-performance LSI circuit which operates with a high degree of reliability can be designed and manufactured easily. Furthermore, either of the first and second PMOS transistors 1 and 2 can serve as an ideal transistor the current drive ability of which is enhanced when it is held at the ON state, and in which the leakage current is low when it is held at the OFF state.

In addition, the SOI CMOS circuit according to the second embodiment of the present invention can operate properly even though the power supply potential VDD is greater than the built-in potential VBL.

Third Embodiment

Figure 6:
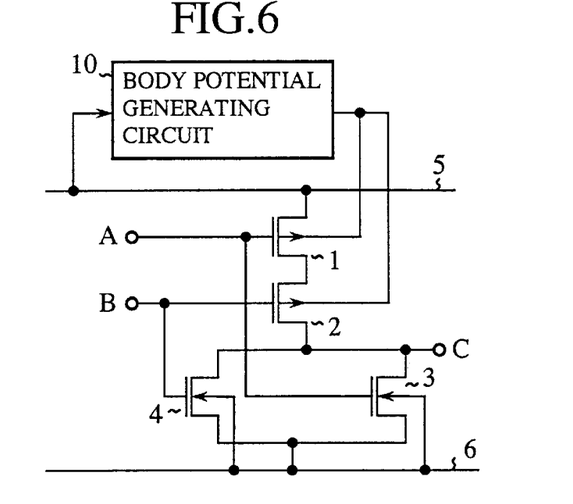
FIG. 6 is a schematic circuit diagram of an SOI CMOS circuit according to a third embodiment of the present invention.

Referring next to FIG. 6, there is illustrated a schematic circuit diagram of an SOI CMOS circuit according to a third embodiment of the present invention. The SOI CMOS circuit of the third embodiment can serve as a NOR gate. In FIG. 6, reference numeral 10 denotes a body potential generating circuit connected between the bodies of the first and second PMOS transistors 1 and 2 and the high reference potential line 5. The other components of the SOI CMOS circuit of the third embodiment are the same as those of the first embodiment shown in FIG. 1.

Figure 7:
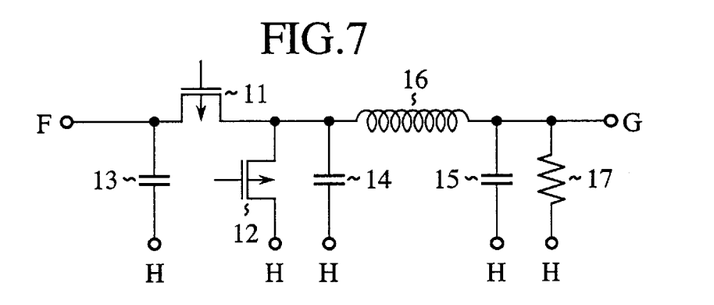
FIG. 7 is a schematic circuit diagram showing the structure of an example of a body potential generating circuit disposed in the SOI CMOS circuit of FIG. 6 according to the third embodiment of the present invention.

Referring next to FIG. 7, there is illustrated a schematic circuit diagram of the body potential generating circuit 10 disposed in the SOI CMOS circuit according to the third embodiment of the present invention. In FIG. 7, reference numerals 11 and 12 denote PMOS transistors, 13 through 15 denote first through third capacitors, 16 denotes a coil, 17 denotes a resistor, F denotes a terminal connected to the high reference potential line 5, G denotes another terminal connected to the bodies of the first and second PMOS transistors 1 and 2, and H denotes another terminal connected to the ground.

Figure 8:
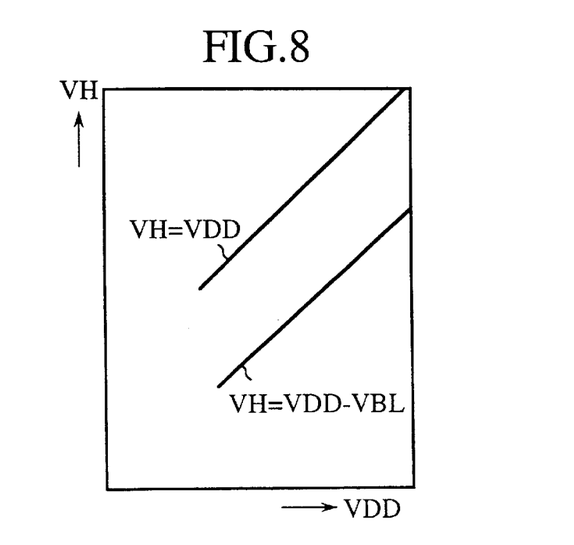
FIG. 8 is a graph showing a range of the potential of the bodies of PMOS transistors included in the SOI CMOS circuit of FIG. 6 according to the third embodiment of the present invention.

In order to set the potential VH of the body of each of the first and second PMOS transistors 1 and 2, referred to the potential of the source of each of the first and second PMOS transistors 1 and 2, the body potential generating circuit 10 disposed in the SOI CMOS circuit according to the third embodiment of the present invention shown in FIG. 7 can generate a body potential having a certain value intermediate between the power supply potential VDD and a value obtained by subtraction of the built-in potential VBL from the power supply potential VDD, and apply the body potential to the bodies of the first and second PMOS transistors 1 and 2, by varying the on/off times of the PMOS transistors 11 and 12 disposed therein, which are turned on and off alternately. To be more specific, by varying the on/off times of the PMOS transistors 11 and 12, the body potential generating circuit sets the body potential of each of the first and second PMOS transistors 1 and 2 to a potential having a certain value intermediate between a line VH=VDD and another line VH=VDD−VBL, as shown in FIG. 8. The vertical axis of FIG. 8 shows the body potential VH, and the horizontal axis shows the power supply potential VDD.

As previously explained, since the SOI CMOS circuit according to the third embodiment of the present invention includes the body potential limiting circuit 10 for generating a body potential having a certain value intermediate between the power supply potential VDD and a value obtained by subtraction of the built-in potential VBL from the power supply potential VDD, and for applying the body potential to the bodies of the first and second PMOS transistors 1 and 2, and the first and second NMOS transistors 3 and 4 having their bodies connected to the low reference potential line 6. Thus when both the first and second PMOS transistors 1 and 2 are held at the ON state, the current drive abilities of the first and second PMOS transistors 1 and 2 are enhanced while the current drive abilities of the first and second NMOS transistors 3 and 4 are not enhanced even though the first and second NMOS transistors 3 and 4 are held at the ON state. As a result, the current drive abilities of the first and second PMOS transistors 1 and 2 approach those of the first and second NMOS transistors 3 and 4, and therefore the difference between currents flowing through the first and second PMOS transistors 1 and 2 and currents flowing through the first and second NMOS transistors 3 and 4 can be reduced. Thus the third embodiment can offer the same advantages as provided by the first embodiment. That is, the logical threshold voltage of the SOI CMOS circuit, which determines the logic levels of signals, can be set correctly to a voltage intermediate between the power supply potential VDD and the ground potential vSS, resulting in a margin for the operation of the SOI CMOS circuit and hence higher noise immunity. Besides since the difference between the rising time and the falling time of output signals can be reduced, a high-performance LSI circuit which operates with a high degree of reliability can be designed and manufactured easily. Furthermore, either of the first and second PMOS transistors 1 and 2 can serve as an ideal transistor the current drive ability of which is enhanced when it is held at the ON state, and in which the leakage current is low when it is held at the OFF state.

In addition, since the bodies of the first and second PMOS transistors 1 and 2 are not connected to their gates, respectively, parasitic capacitance that resides in the gate of each of the first and second PMOS transistors 1 and 2 can be reduced, compared with the first and second embodiments mentioned above.

Furthermore, since the bodies of the first and second PMOS transistors 1 and 2 are connected to the high reference potential line 5 by way of the body potential generating circuit 10, the bodies of the first and second PMOS transistors 1 and 2 can be held constantly at the body potential VH. Accordingly, a more proper simulation can be performed when modeling the SOI CMOS circuit of this embodiment, as compared with when modeling the SOI CMOS circuits of the first and second embodiments wherein the potential of the body of each of the first and second PMOS transistors 1 and 2 can be varied, with the result that SOI CMOS circuits with a high degree of reliability can be easily designed and manufactured. This is because the electric characteristics of transistors are varied in a complicated way as their bodies' potential VH is varied.

Figure 9:
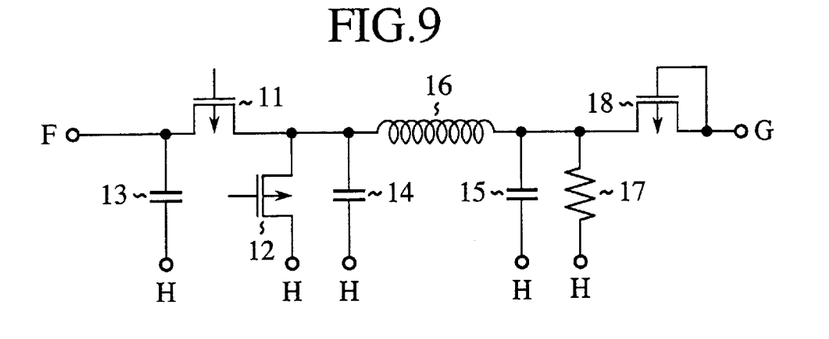
FIG. 9 is a schematic circuit diagram showing the structure of another example of the body potential generating circuit disposed in the SOI CMOS circuit of FIG. 6 according to the third embodiment of the present invention.

In case that the body potential generating circuit 10 shown in FIG. 7 cannot set the potential VH of the body of each of the first and second PMOS transistors 1 and 2 to a certain value in a range from the power supply potential VDD to a value obtained by subtraction of the built-in potential VBL from the power supply potential VDD, it is preferable to incorporate another PMOS transistor 18 having its gate and drain connected to each other into the body potential generating circuit 10 shown in FIG. 7, as shown in FIG. 9, with the result that the potential VH of the body of each of the first and second PMOS transistors 1 and 2 can be set to a certain value in the range from the power supply potential VDD to the value obtained by subtraction of the built-in potential VBL from the power supply potential VDD.

Fourth Embodiment

Figure 10:
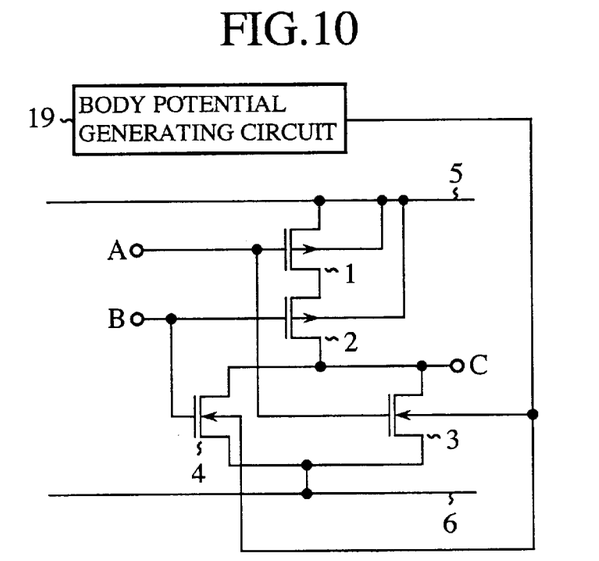
FIG. 10 is a schematic circuit diagram of an SOI CMOS circuit according to a fourth embodiment of the present invention.

Referring next to FIG. 10, there is illustrated a schematic circuit diagram of an SOI CMOS circuit according to a fourth embodiment of the present invention. The SOI CMOS circuit of the fourth embodiment can serve as a NOR gate. In FIG. 10, reference numeral 19 denotes a body potential generating circuit for generating a body potential to be applied to the bodies of first and second NMOS transistors 3 and 4. The bodies of first and second PMOS transistors 1 and 2 are connected to a high reference potential line 5. The other components of the SOI CMOS circuit of the fourth embodiment are the same as those of the first embodiment shown in FIG. 1.

Figure 11:
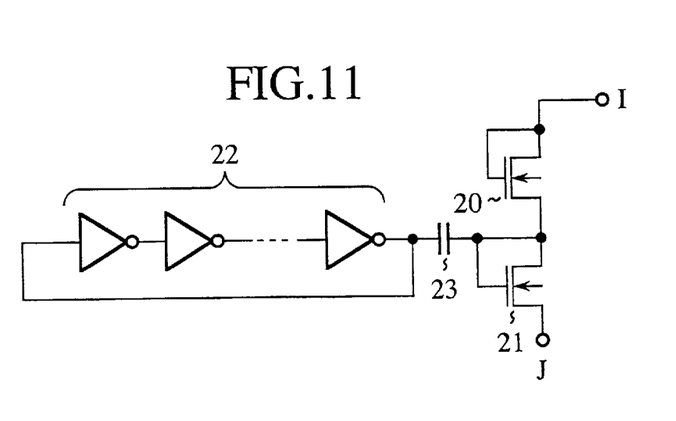
FIG. 11 is a schematic circuit diagram showing the structure of an example of a body potential generating circuit disposed in the SOI CMOS circuit of FIG. 10 according to the fourth embodiment of the present invention.

Referring next to FIG. 11, there is illustrated a schematic circuit diagram of the body potential generating i5 circuit 19 disposed in the SOI CMOS circuit according to the fourth embodiment of the present invention. In FIG. 11, reference numerals 20 and 21 denote third and fourth NMOS transistors, respectively, 22 denotes a ring oscillator including an odd number of inverters connected in series to each other, 23 denotes a capacitor, I denotes a terminal connected to the bodies of the first and second NMOS transistors 3 and 4, and J denotes another terminal connected to the ground. Each of the plurality of inverters in the ring oscillator 22 is connected to the high reference potential line 5.

Figure 12:
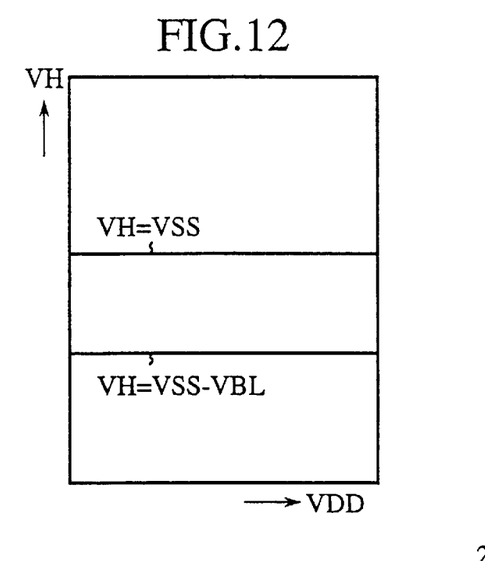
FIG. 12 is a graph showing a range of the potential of the bodies of NMOS transistors included in the SOI CMOS circuit of FIG. 10 according to the fourth embodiment of the present invention.
Figure 13:
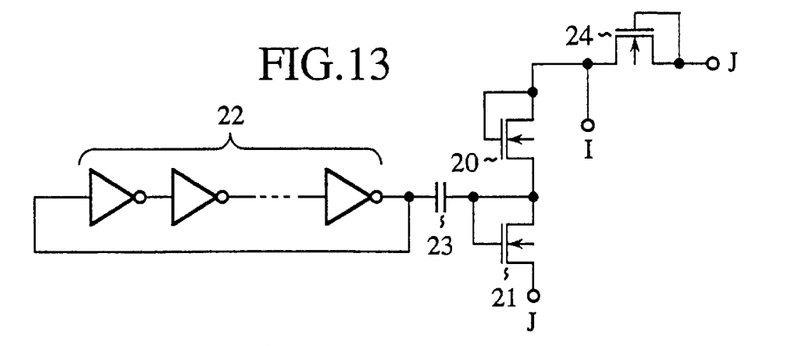
FIG. 13 is a schematic circuit diagram showing the structure of another example of the body potential generating circuit disposed in the SOI CMOS circuit of FIG. 10 according to the fourth embodiment of the present invention.

In order to set the potential VH of the body of each of the first and second NMOS transistors 3 and 4, referred to the potential of the source of each of the first and second NMOS transistors 3 and 4, the body potential generating circuit 19 disposed in the SOI CMOS circuit according to the fourth embodiment of the present invention shown in FIG. 11 can generate a body potential having a certain value below the ground potential VSS and apply the body potential to the bodies of the first and second NMOS transistors 3 and 4. The vertical axis of FIG. 12 shows the body potential VH of each of the first and second NMOS transistors 3 and 4, and the horizontal axis shows the power supply potential VDD.

As previously explained, since the SOI CMOS circuit according to the fourth embodiment of the present invention includes the body potential generating circuit 19 for generating a body potential having a certain value below the ground potential VSS and for applying the body potential to the bodies of the first and second NMOS transistors 3 and 4, and the first and second PMOS transistors 1 and 2 having their bodies connected to the high reference potential line 5. Thus the current drive abilities of the first and second NMOS transistors 3 and 4 are reduced when the first and second NMOS transistors 3 and 4 are held at the ON state, while the current drive abilities of the first and second PMOS transistors 1 and 2 are not enhanced even though both the first and second PMOS transistors 1 and 2 are held at the ON state. As a result, the current drive abilities of the first and second NMOS transistors 3 and 4 approach those of the first and second PMOS transistors 1 and 2, and therefore the difference between currents flowing through the first and second PMOS transistors 1 and 2 and currents flowing through the first and second NMOS transistors 3 and 4 can be reduced. Therefore, the logical threshold voltage of the SOI CMOS circuit, which determines the logic levels of signals, can be set correctly to a voltage intermediate between the power supply potential VDD and the ground potential VSS without having to change the sizes of the first and second PMOS transistors 1 and 2 and the first and second NMOS transistors 3 and 4, resulting in a margin for the operation of the SOI CMOS circuit and hence higher noise immunity. In addition, since the difference between the rising time and the falling time of output signals can be reduced, a high-performance LSI circuit which operates with a high degree of reliability can be designed and manufactured easily.

Japanese Patent Application Laying open (KOKAI) No. 3-66159 discloses a CMOS circuit in which the body of a built-in PMOS transistor is held at a certain positive potential. Similarly, Japanese Patent Application Laying open (KOKAI) No. 9-55652 discloses a CMOS circuit in which the body of a built-in NMOS transistor is held at a certain negative potential. However, these references do not disclose the values of the potentials of the bodies of the PMOS and NMOS transistors.

Many widely different embodiments of the present invention may be constructed without departing from the spirit and scope of the present invention. It should be understood that the present invention is not limited to the specific embodiments described in the specification, except as defined in the appended claims.

What is claimed is:

1. A Silicon-On-Insulator (SOI) CMOS circuit comprising:

first and second PMOS transistors connected in series to each other, each of said PMOS transistors having its body and gate connected to each other, and the gate of said first PMOS transistor connected to a first input terminal, and the gate of said second PMOS transistor connected to a second input terminal; and an NMOS transistor connected to one of said PMOS transistors, said NMOS transistor having its body connected to a low reference potential having a value of ground wherein turning said first and said second PMOS transistors from an OFF state to an ON state increases a current drive ability of each of said first and said second PMOS transistors to approach a current drive ability of said NMOS transistor.

2. The SOI CMOS circuit according to claim 1, further comprising first and second potential limiting circuits connected between the body and gate of said first and second PMOS transistors, respectively, for setting a lower limit of the potential of the body of each of said PMOS transistors to a voltage between a high reference potential and a potential obtained by subtracting a built-in potential from the high reference potential.

3. The SOI CMOS circuit according to claim 2, wherein each of said first and second potential limiting circuits includes a third PMOS transistor having its source connected to the gate of a corresponding one of said first and second PMOS transistors, and its gate connected to its drain and the body of the corresponding one of said first and second PMOS transistors.

4. The SOI CMOS circuit according to claim 1, wherein the gate of said NMOS transistor is connected to said first input terminal.

5. The SOI CMOS circuit according to claim 1, further including an other NMOS transistor connected to said one of said PMOS transistors, said other NMOS transistor having its body connected to the low reference potential having the value of ground.

6. The SOI CMOS circuit according to claim 5, wherein the gate of said NMOS transistor is connected to said first input terminal, and the gate of said other NMOS transistor is connected to said second input terminal.

7. The SOI CMOS circuit according to claim 5, further comprising first and second potential limiting circuits connected between the body and gate of said first and second PMOS transistors, respectively, for setting a lower limit of the potential of the body of each of said first and second PMOS transistors to a voltage between a high reference potential and a potential obtained by subtracting a built-in potential from the high reference potential.

8. The SOI CMOS circuit according to claim 7, wherein each of said first and second potential limiting circuits includes a third PMOS transistor having its source connected to the gate of a corresponding one of said first and second PMOS transistors, and its gate connected to its drain and the body of the corresponding one of said first and second PMOS transistors.

9. The SOI CMOS circuit according to claim 1, wherein said first and said second PMOS transistors each have a lower current drive ability than said NMOS transistor when a first potential having the value of ground is applied to the body of said NMOS transistor and a second potential having a value higher than the value of ground is applied to the bodies of said first and second PMOS transistors, the value of the second potential being equal to a value of high logic level applied to the gate of said first PMOS transistor.

10. The SOI CMOS circuit according to claim 2, wherein each of said first and second potential limiting circuits includes an MOS transistor having a drain and a gate connected to each other.

11. The SOI CMOS circuit according to claim 2, wherein each of said first and second potential limiting circuits includes an MOS transistor having a drain and a gate connected to each other.

* * * * *